(12) United States Patent
Cheifetz et al.

(10) Patent No.: US 10,910,193 B2
(45) Date of Patent: Feb. 2, 2021

(54) PARTICLE DETECTION ASSEMBLY, SYSTEM AND METHOD

(71) Applicant: EL-MUL TECHNOLOGIES LTD., Rehovot (IL)

(72) Inventors: Eli Cheifetz, Ramat Gan (IL); Amit Weingarten, Ramat Gan (IL); Semyon Shopman, Kiryat Ekron (IL); Silviu Reinhorn, Mevaseret Zion (IL); Dmitry Shur, Holon (IL)

(73) Assignee: EL-MUL TECHNOLOGIES LTD., Rehovot (IL)

( * ) Notice: Subject to any disclaimer, the term of this patent is extended or adjusted under 35 U.S.C. 154(b) by 0 days.

(21) Appl. No.: 16/356,539

(22) Filed: Mar. 18, 2019

(65) Prior Publication Data

US 2019/0259571 A1    Aug. 22, 2019

Related U.S. Application Data

(63) Continuation-in-part of application No. 15/253,905, filed on Sep. 1, 2016, now Pat. No. 10,236,155.

(60) Provisional application No. 62/214,088, filed on Sep. 3, 2015.

(51) Int. Cl.
*H01J 37/244* (2006.01)
*H01J 37/22* (2006.01)
*H01J 37/26* (2006.01)

(52) U.S. Cl.
CPC .......... *H01J 37/244* (2013.01); *H01J 37/226* (2013.01); *H01J 37/26* (2013.01); *H01J 2237/2443* (2013.01); *H01J 2237/2445* (2013.01)

(58) Field of Classification Search
CPC .......... H01J 37/244; H01J 37/26; H01J 37/28
See application file for complete search history.

(56) References Cited

U.S. PATENT DOCUMENTS

| | | | |
|---|---|---|---|
| 10,236,155 B2 * | 3/2019 | Cheifetz | H01J 37/244 |
| 2008/0315094 A1 * | 12/2008 | Wang | H01J 37/244 |
| | | | 250/310 |
| 2012/0273677 A1 * | 11/2012 | Tuma | H01J 37/145 |
| | | | 250/307 |

* cited by examiner

*Primary Examiner* — Eliza W Osenbaugh-Stewart
(74) *Attorney, Agent, or Firm* — Alphapatent Associates, Ltd; Daniel J. Swirsky

(57) ABSTRACT

An electron detector assembly configured for detecting electrons emitted from a sample irradiated by an electron beam, including a scintillator configured with a scintillator layer formed with a scintillating surface. The scintillator layer emits light signals corresponding to impingement of electrons upon the scintillating surface. A light guide plate is coupled to the scintillator layer and includes a peripheral surface. One or more silicon photomultiplier devices are positioned upon the peripheral surface, wherein one or more silicon photomultiplier devices are arranged perpendicularly or obliquely relative to the scintillating surface. The silicon photomultiplier device is configured to yield an electrical signal from an electron impinging upon the scintillator surface.

18 Claims, 20 Drawing Sheets

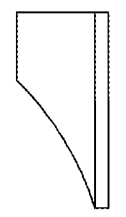
FIG. 3D
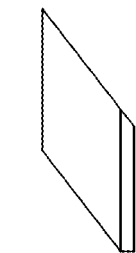
FIG. 3E
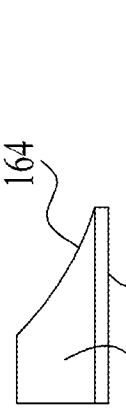
FIG. 3A
FIG. 3B
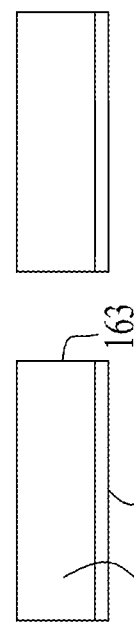
FIG. 3C

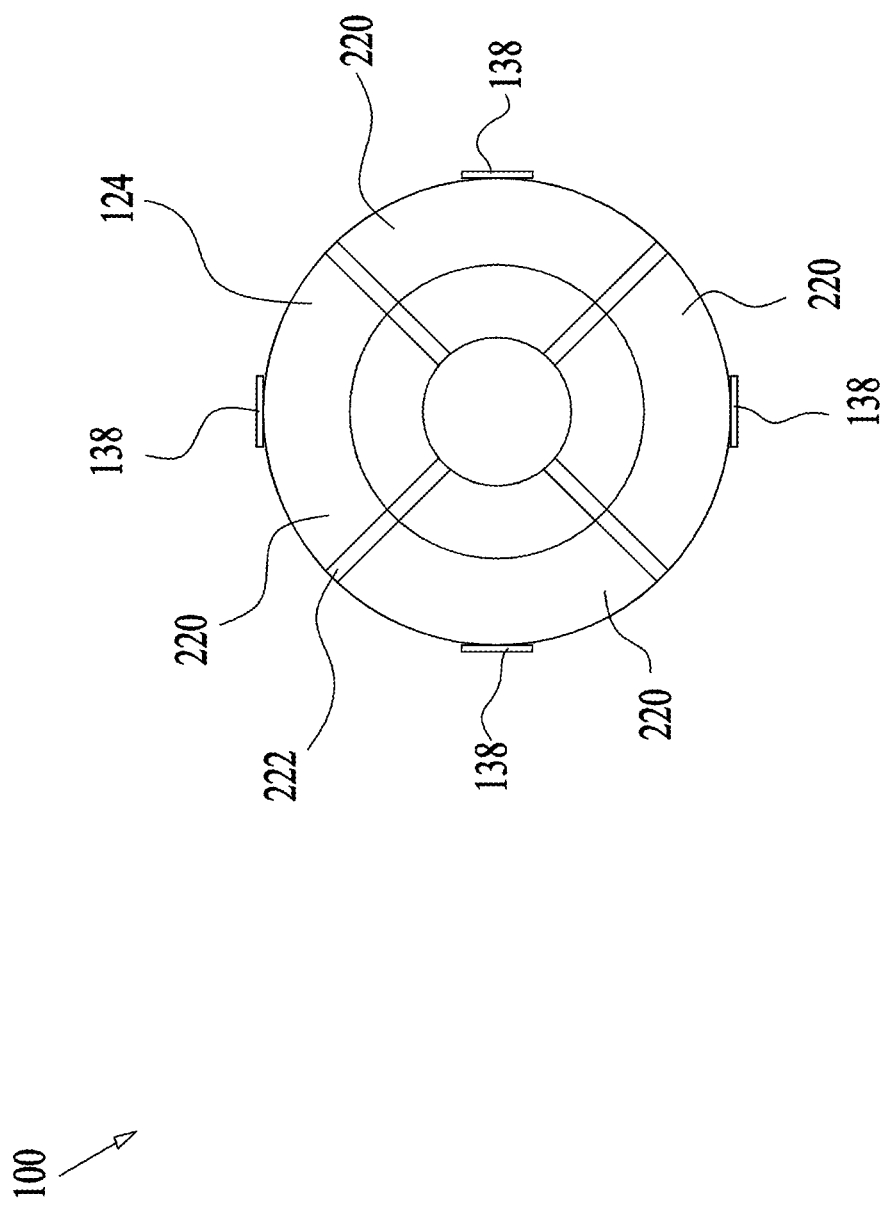

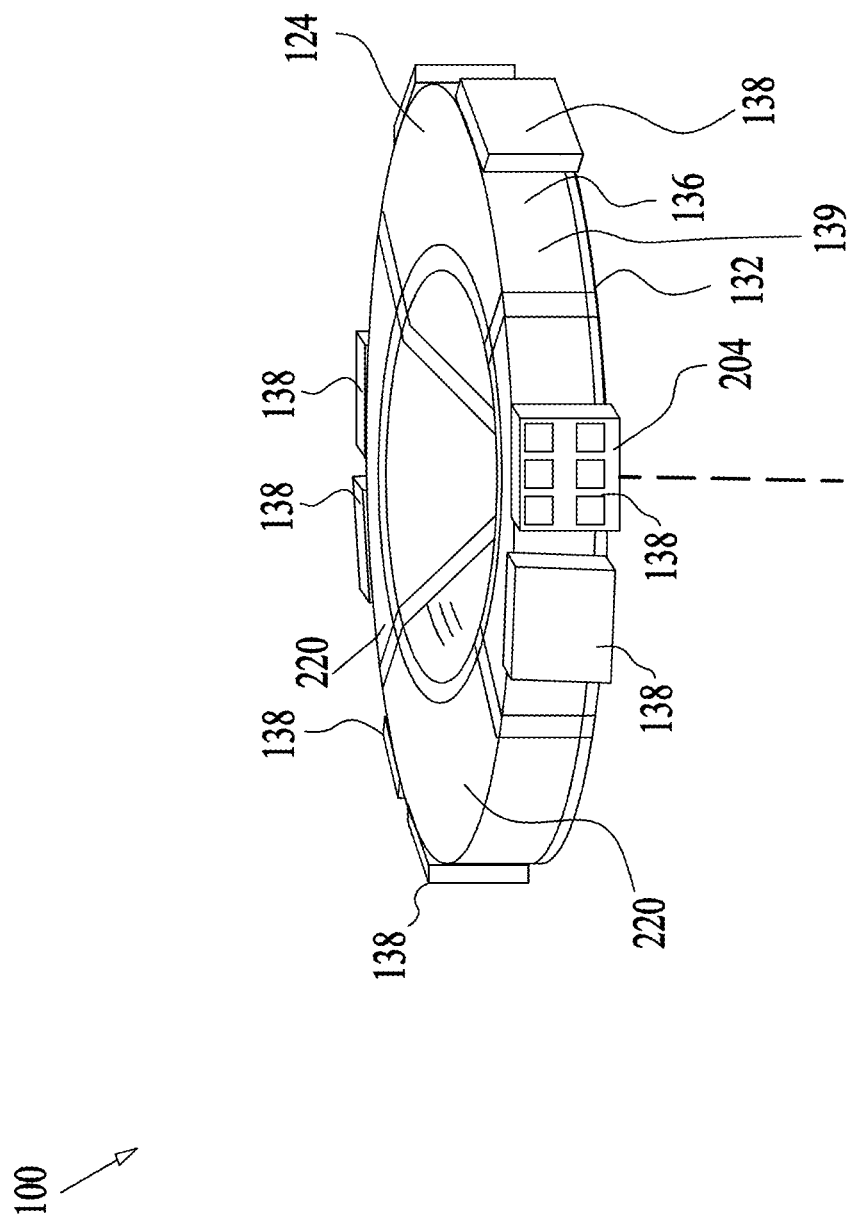

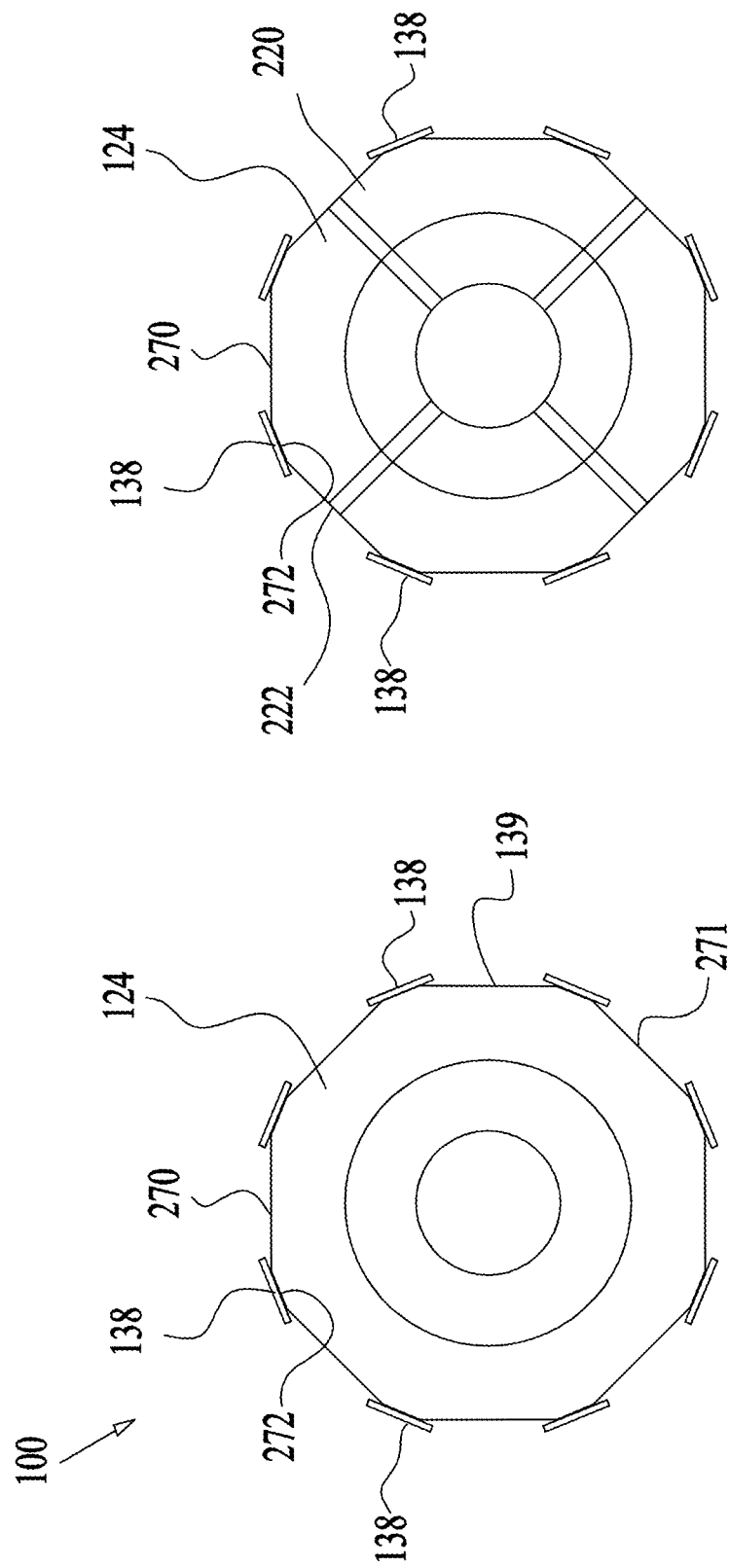

PARTICLE DETECTION ASSEMBLY, SYSTEM AND METHOD

CROSS-REFERENCE TO RELATED APPLICATIONS

This Application is a continuation-in-part of U.S. application Ser. No. 15/253,905, filed Sep. 1, 2016, titled "Detection Assembly, System and Method," which claims priority benefit from U.S. Provisional Application No. 62/214,088, filed Sep. 3, 2015, titled "In-Chamber BSE Detector Comprising In-Vacuum Scintillator and Photon Detector," the disclosures of which are incorporated herein by reference in their entirety.

TECHNICAL FIELD

This disclosure relates generally to systems for detecting charged particles emitted from a sample and, more particularly, to detecting electrons emitted from a sample irradiated by an electron beam.

BACKGROUND

Back Scattered Electrons (BSE) and Secondary Electrons (SE), can be emitted from a sample upon irradiation thereof by an electron beam within a microscope. Detecting BSE and SE can reveal material and surface properties of the irradiated sample. Common BSE and SE detectors include semiconductor diode detectors that produce an electric current upon an electron traversing thereon or Robinson-type detectors wherein electrons strike a scintillator layer producing photons transmitted through a light guide to a light sensor.

The semiconductor diode detector is speed limited and produces high noise and is thus less suitable for high scanning rate performance. Moreover, for SE detection, which requires operation at high voltages, use of semiconductor diode detector is undesirable. The Robinson-type detector extracts the signal via a rigid light guide through a bulky vacuum flange crowding the chamber of the microscope and imposing mechanical restrictions on the detection system. Its unidirectional light guide creates non-uniformity in the signal received from the electrons. Few light guide configurations are also possible, but impose higher complexity and cost.

SUMMARY

The following summary of the invention is included in order to provide a basic understanding of some aspects and features of the disclosure. This summary is not an extensive overview of the disclosure and as such, it is not intended to particularly identify key or critical elements of the disclosure or to delineate the scope of the disclosure. Its sole purpose is to present some concepts of the disclosure in a simplified form as a prelude to the more detailed description that is presented below.

There is provided in accordance with an embodiments of the present disclosure, an electron detector assembly configured for detecting electrons emitted from a sample irradiated by an electron beam, comprising: a scintillator comprising a scintillator layer, the scintillator layer emitting light signals corresponding to impingement of electrons thereupon, a light guide plate coupled to the scintillator layer and comprising a peripheral surface, and a single or plurality of silicon photomultiplier devices positioned upon the peripheral surface and arranged perpendicularly or obliquely relative to the scintillating surface, the silicon photomultiplier device being configured to yield an electrical signal from an electron impinging upon the scintillator layer.

In some embodiments, the electrons comprise at least one of backscatter electrons (BSE), secondary electrons (SE), tertiary electrons (SE3) or a combination thereof. In some embodiments, the SE comprise accelerated SE.

In some embodiments, the light guide plate is formed with a central bore to allow the electron beam to propagate therethrough. The central bore may be formed with an internal perpendicular wall in respect to the scintillator layer. Alternatively, the central bore may be formed with an internal inclined wall in respect to the scintillator layer. In some embodiments, the central bore is formed with an internal wall coated with a partial or complete reflective/diffusive layer.

In some embodiments, an additional silicon photomultiplier device is positioned on a top surface of the electron detector assembly and arranged parallel to the scintillator layer. In some embodiments, the assembly comprises a top surface and the assembly is formed with a partial or complete reflective/diffusive coating at least one of the peripheral surface and the top surface or a combination thereof.

In some embodiments, the assembly is configured to facilitate detection of a spatial location of the electrons according to the spatial location of an input signal generated by electrons impinging upon the scintillator layer.

In some embodiments, a voltage supplier is provided to bias the scintillator layer relative to the sample thereby accelerating secondary electrons (SE) to the detector, or tertiary electrons (SE3) to the detector or a combination thereof.

In some embodiments, the assembly is positioned intermediate a pole piece of an electron beam column and the sample. Alternatively, or in addition thereto, the assembly is positioned within the electron beam column. In some embodiments, the central bore of the assembly is positioned in alignment with the electron beam.

In some embodiments, the assembly is positioned at a lateral distance away and off-axis from an electron beam column.

In some embodiments, the assembly is configured to detect ions emitted from the sample.

There is provided in accordance with an embodiments of the present disclosure, an electron detection system, comprising: an electron beam irradiating a sample, an electron detector assembly for detecting electrons emitted from the sample comprising: a scintillator comprising a scintillator layer, the scintillator layer emitting light signals corresponding to impingement of electrons thereupon, a light guide plate coupled to the scintillator and comprising a peripheral surface, and a single or plurality of silicon photomultiplier devices positioned upon the peripheral surface and arranged perpendicularly or obliquely relative to the scintillating surface, the silicon photomultiplier device being configured to yield an electrical signal from electrons impinging upon the scintillator layer.

There is provided in accordance with an embodiments of the present disclosure, a method for detecting electrons emitted from a sample irradiated by an electron beam, comprising irradiating a sample by an electron beam, providing an electron detector assembly comprising: a scintillator comprising a scintillator layer, the scintillator layer emitting light signals corresponding to impingement of electrons thereupon, a light guide plate coupled to the scintillator and comprising a peripheral surface, and a single or plurality of silicon photomultiplier devices positioned upon the peripheral surface and arranged perpendicularly or obliquely to the scintillating surface, the silicon photomultiplier device being configured to yield an electrical signal from electrons impinging upon the scintillator layer, thereby detecting electrons emitted from the sample.

There is provided in accordance with an embodiments of the present disclosure, an electron detector assembly configured for detecting electrons emitted from a sample irradiated by an electron beam, comprising: a scintillator including a scintillator layer with a scintillating surface, the scintillator layer emitting light signals corresponding to impingement of electrons upon the scintillating surface, a light guide plate coupled to the scintillator layer and comprising a peripheral surface, the light guide plate being segmented into two or more segments; and two or more silicon photomultiplier devices positioned upon the peripheral surface of a least one of the segments, wherein the two or more silicon photomultiplier devices are arranged perpendicularly or obliquely relative to the scintillating surface, the silicon photomultiplier device being configured to yield an electrical signal from an electron impinging upon the scintillator surface by collecting the light produced by the electron in the scintillator via the light guide.

In some embodiments, at least one or more of the two or more silicon photomultiplier devices is connected to its individual pre-amplifier. In some embodiments, in a common segment, an output of a first individual pre-amplifier is connected directly to an output of a second individual pre-amplifier. In some embodiments, at least two individual pre-amplifier outputs are connected to an additional amplifier, which provides a summing and buffering function for, at least, two signals from corresponding silicon photomultiplier devices attached to the common segment.

In some embodiments, the light guide plate is formed with a central bore to allow the electron beam to propagate therethrough.

In some embodiments, the central bore is formed with an internal inclined wall in respect to the scintillator surface. In some embodiments, the central bore is formed with an internal wall coated with a partial or complete reflective/diffusive layer. In some embodiments, the assembly is positioned within an electron beam column. In some embodiments, at least a portion of a wall surface of a segment is covered with a reflective layer, the wall surface is substantially perpendicular to the scintillator surface.

In some embodiments, the scintillator layer is segmented into the two or more segments and is covered with the reflective layer at its wall surface. In some embodiments, at least one of the segments is coupled to two or more silicon photomultiplier devices positioned on the peripheral surface.

There is provided in accordance with an embodiments of the present disclosure, an electron detector assembly configured for detecting electrons emitted from a sample irradiated by an electron beam, including a scintillator formed with a scintillator layer including a scintillating surface, the scintillator layer emitting light signals corresponding to impingement of electrons upon the scintillating surface, a light guide plate coupled to the scintillator layer and including a peripheral surface, a single or plurality of silicon photomultiplier devices positioned upon the peripheral surface, wherein the silicon photomultiplier devices are arranged perpendicularly or obliquely relative to the scintillating surface, the silicon photomultiplier device being configured to yield an electrical signal from an electron impinging upon the scintillator surface, wherein the silicon photomultiplier device is formed as a chip with a generally flat plane surface; and a fixing element for securing the flat plane surface of the chip to the peripheral surface of the light guide plate.

In some embodiments, the peripheral surface is configured as a curved surface. In some embodiments, the peripheral surface is configured with at least some flat portions or flat edges. In some embodiments, at least one of the silicon photomultiplier devices is attached to a flat edge.

In some embodiments, the fixing element includes a clamp configured to at least partially surround the light guide plate. In some embodiments, the clamp includes a protruding element for pressing upon the silicon photomultiplier device. In some embodiments, the peripheral surface is configured as a convex polygon.

There is provided in accordance with an embodiments of the present disclosure, an electron detector assembly configured for detecting electrons emitted from a sample irradiated by an electron beam, including a scintillator formed with a scintillator layer including a scintillating surface, the scintillator layer emitting light signals corresponding to impingement of electrons upon the scintillating surface; a light guide plate coupled to the scintillator layer and including a peripheral surface, and one or more silicon photomultiplier devices positioned upon the peripheral surface, wherein the one or more silicon photomultiplier devices are arranged perpendicularly or obliquely relative to the scintillating surface, the silicon photomultiplier device being configured to yield an electrical signal from an electron impinging upon the scintillator surface.

In some embodiments, the peripheral surface is configured as a convex polygon.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 3A-3E are each a simplified cross-sectional illustration of elements of an electron detection system constructed and operative in accordance with an embodiment of the present disclosure;

FIGS. 9A-9D are a simplified pictorial illustration of an electron detection system, a top view and a first and second sectional illustrations of a single segment of an electron detection system, respectively, constructed and operative in accordance with an embodiment of the present disclosure;

FIGS. 10A-10D are a simplified pictorial illustration of an electron detection system, a top view and a first and second sectional illustrations of a single segment of an electron detection system, respectively, constructed and operative in accordance with an embodiment of the present disclosure;

FIGS. 13A and 13B are each a simplified top view illustration of an electron detection system, constructed and operative in accordance with an embodiment of the present disclosure.

DETAILED DESCRIPTION

In the following description, various aspects of the present invention will be described with reference to different embodiments. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Figure 1A:
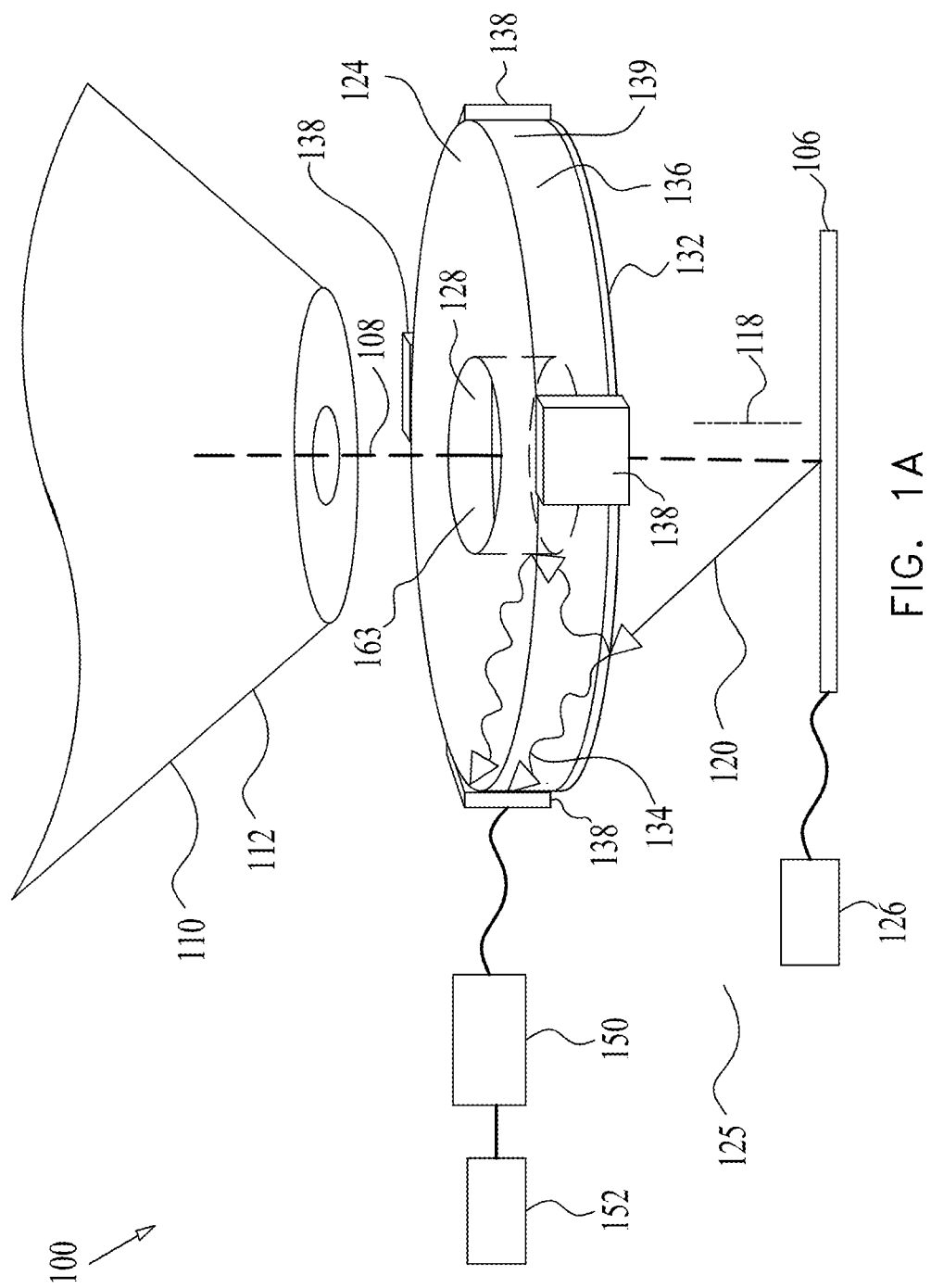
FIGS. 1A and 1B are each a simplified pictorial illustration of an electron detection system constructed and operative in accordance with an embodiment of the present disclosure.

FIGS. 1A-6 are each a simplified pictorial illustration of an electron detection system constructed and operative in accordance with an embodiment of the present disclosure. As seen in FIG. 1A, an electron detection system 100 is configured to detect electrons emitted from a sample 106. The sample 106 is irradiated by an electron beam 108 emanating from a pole piece 110 of an electron beam column 112 and forming a beam path along a beam axis 118.

Irradiating the sample 106 by electron beam 108 stimulates emission of charged particles from the sample 106. The emitted particles comprise, inter alia, electrons 120 which may include, secondary electrons (SE), backscattered electrons (BSE), emitted from the sample 106 at a plurality of dispersion angles and/or tertiary electrons (SE3).

In some embodiments, the electrons 120 are detected by an electron detector 124 configured to detect electrons impinging thereupon and yield an electrical signal therefrom. (The detector 124 may be shown not to scale).

In some embodiments, the emitted electrons 120 comprise BSE, typically emitted from the sample 106 at energies from 50 eV to the energy level of the electron beam 108. In some embodiments, emitted electrons 120 comprise SE, which typically include electrons emitted from the sample at energies below 50 eV, with most electrons emitted at energies between 1 eV-6 eV. In addition to the emitted BSE and/or the SE, SE3 may be emitted from other surfaces within the electron detection system 100 in response to impingement of SE or BSE on these surfaces (e.g. the pole piece 100, walls of a vacuum chamber 125 housing the electron beam column 112).

The sample 106 (or the detector 124 or any other suitable element in the electron detection system 100) may be negatively biased with an appropriate voltage in respect to a scintillator layer 132, thereby propelling SE emitted from the sample 106 and/or SE3 emitted from any location in the electron detection system 100, to accelerate to the scintillator layer 132 and thus be detected by detector 124. A voltage supplier 126 may be provided.

In some embodiments, the electron detector 124 may be formed with a central bore 128 to allow the electron beam to propagate therethrough to the sample 106. The electron detector 124 may comprise a scintillator layer 132 on an underside proximal to the sample 106 and is configured to convert electrons 120 impinging thereon to light signals, namely photons 134. The scintillator layer 132 may be coupled to or deposited on a light guide plate 136, transmitting the light to a light sensor, thereby yielding an electrical signal from an electron impinging upon the scintillator layer 132. The light guide plate 136 may be formed of any suitable light transmitting material, such as glass or plastic or scintillating light transmitting crystal (e.g. organic, inorganic etc.), the same or different from the material forming the scintillator layer 132. The scintillator layer 132 may comprise any suitable material such as powder, a crystal, a quantum well device or a quantum dot device, for example. The light guide plate 136 and/or the scintillator layer 132 may be formed in any shape suitable for a detector, such as an annular disk or ring, for example.

In accordance with an embodiment of the present disclosure the light sensor may comprise a single or a plurality of silicon photomultiplier devices 138. The silicon photomultiplier devices 138 may be positioned unparallel and angled in respect to the plane of the scintillator layer 132, such as being arranged perpendicularly or obliquely in respect to the scintillator layer 132. As seen in FIGS. 1A-6, the silicon photomultiplier devices 138 are placed generally orthogonally to the scintillator layer 132 on a peripheral surface 139 of the light guide plate 136. Though it is appreciated that the scintillator layer 132 may be placed at any angular distance relative to the scintillator layer 132.

Figure 4:
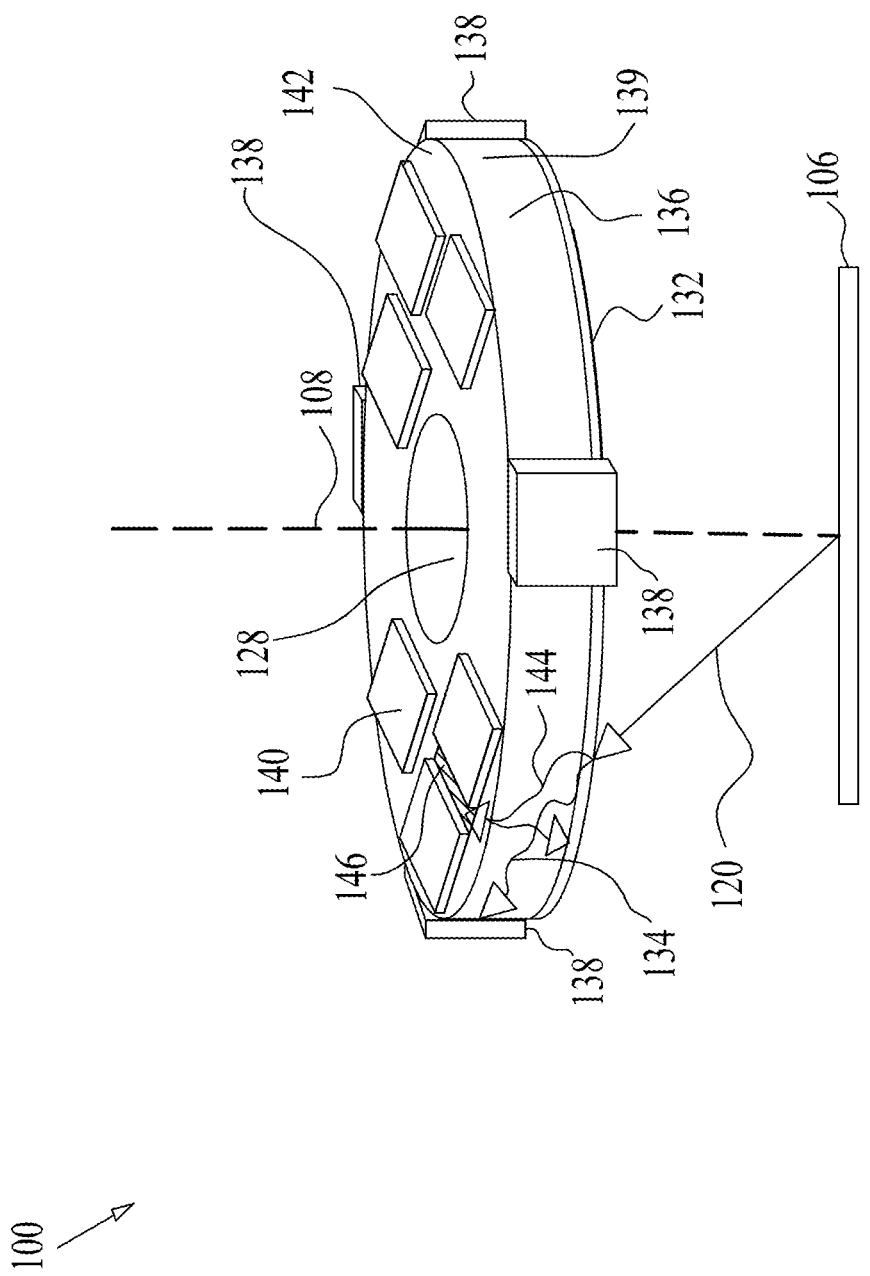
FIG. 4 is a simplified pictorial illustration of an electron detection system constructed and operative in accordance with an embodiment of the present disclosure.

In some embodiments, optional additional silicon photomultiplier devices 140 may be placed parallel to the scintillator layer 132 on a top surface 142 in addition to the angularly placed silicon photomultiplier devices 138, as seen in FIG. 4.

Constructing a detector 124 with angularly placed silicon photomultiplier devices 138 relative to the scintillator layer 132 facilitates higher photon collection than placing the silicon photomultiplier devices parallel to the scintillator layer 132 only. As illustrated in FIG. 4, a photon, here referenced as photon 144, propagating from the scintillator layer 132 may impinge upon a "dead region" 146 on top surface 142 formed intermediate the parallel silicon photomultiplier devices 140. Such a photon 144 remains undetected by the parallel silicon photomultiplier devices 140. Yet photons 134 which impinge the light guide surfaces which are unparallel to scintillator layer 132 (e.g. the peripheral surface 139 or internal inclined wall 160 (FIG. 2)), which are diffusive or reflective or both, are reflected or diffused to disperse in many directions and thus reach at least one of the angled silicon photomultiplier devices 138. Accordingly, the collection efficiency of the detector 124 formed with angled silicon photomultiplier devices 138 is improved.

Furthermore, a photon 134 impinging upon a "dead region" 146 or any other area on top surface 142, may be reflected back to the scintillator layer 132 and absorbed, thereby standing undetected. Whilst photons 134 impinging upon the peripheral surface 139 or internal inclined wall 160 are typically reflected and/or diffused (such as when peripheral surface 139 or internal inclined wall 160 is coated with a reflective/diffusive layer) to other regions on the peripheral surface 139 and detected by the angled silicon photomultiplier devices 138, thereby enhancing the collection uniformity.

Figure 1B:
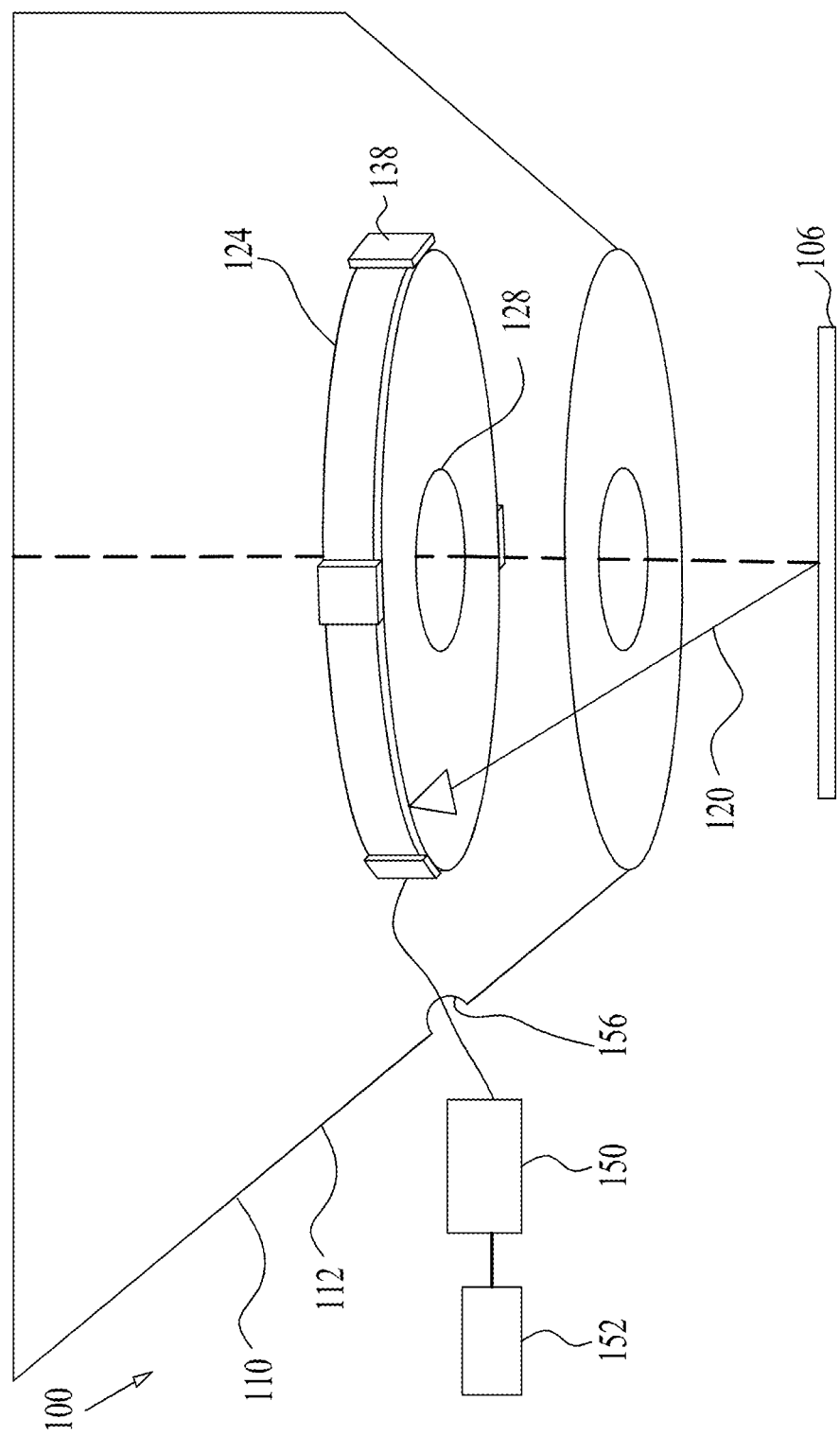

Moreover, in some embodiments, maintaining a relatively thin detector 124 (in respect to the longetudanal axis 118) allows placing the detector 124 unobstructedly under the pole piece 110, as seen in FIG. 1A or within the electron beam column 112, as seen in FIG. 1B.

The Silicon Photomultiplier device 138, may be commercially available typically in sizes of squares of 1 to 6 mm sides, integrates a dense array of relatively small, electrically and optically isolated Geiger-mode silicon photodiodes. Each photodiode element in the array is referred to as a microcell. Typically numbering between 100 and 10,000 per square millimeter, each microcell has its own quenching resistor. The signals of all or most microcells are then summed to form the output of the Silicon Photomultiplier device 138. Each microcell detects photons by discharging its charge generally identically and independently. The size of the silicon photomultiplier device 138 may be selected according to the desired the array size.

The silicon photomultiplier device 138 typically benefits from high gain and good photon detection efficiency (e.g. with an efficiency of about 20% and higher, such as in a range of 20%-45%), along with the physical advantage of compactness, ruggedness and magnetic insensitivity. The silicon photomultiplier device 138 achieves its high gain (e.g. approximately in the range of $10^4$-$10^6$) with very low bias voltages (e.g. from about 30V to about 80V) and the noise may be almost entirely at the single photon level. Because of the high degree of uniformity between the microcells the silicon photomultiplier device 138 is capable of discriminating the precise number of photoelectrons detected as distinct, discrete levels at an output node. Furthermore, the silicon photomultiplier device 138 provides excellent timing resolution with a fast risetime (e.g. in the order of sub-nanoseconds). In some embodiments, the ability to measure a well resolved photoelectron spectrum is a feature of the silicon photomultiplier device 138 which is generally challenging to achieve with a PMT due to the variability in the gain, or excess noise.

In some embodiments, the resultant signal from the silicon photomultiplier device 138 may be conditioned by a pre-amplifier module 150 (FIG. 1A) and transmitted to a signal processing unit 152 for further processing and analysis thereof. In some embodiments, and the signal generated by the silicon photomultiplier device 138 is based on an intensity of the electrons that impinged on the scintillator layer 132, and the signal processing unit 152 and associated electronic circuitry is structured to generate an image of the specimen 106 of the signal generated by the single or plurality of silicon photomultiplier devices 138.

Figure 7E:
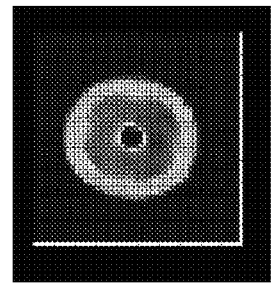
FIGS. 7A-7E are simplified graphical illustrations of electrons detected by an electron detector within an electron detection system of FIG. 2.
Figure 7B:
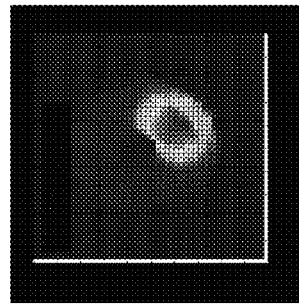
Figure 7D:
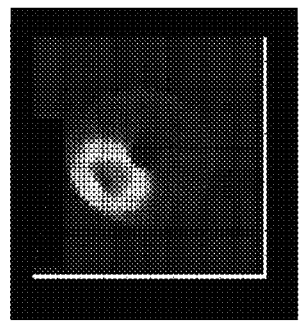
Figure 7A:
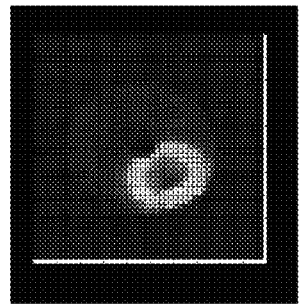
Figure 7C:
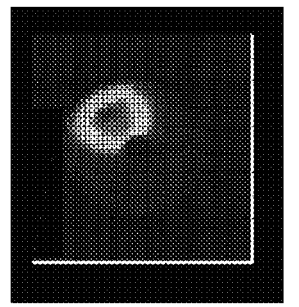

In some embodiments, a plurality of silicon photomultiplier devices 138 may be equidistantly or non-equidistantly placed around the peripheral surface 139. This arrangement facilitates detection of the spatial location of the electrons 120 according to the spatial location of the input signal generated by an electron 120 impinging upon the scintillator layer 132. In FIGS. 7A-7E there are shown graphical illustrations of BSEs detected by an electron detector 124 equipped with four equidistantly placed silicon photomultiplier devices 138. Each individual silicon photomultiplier device 138 collects signals mainly from a single quadrat segment of the scintillator layer 132. Thus each of the scans shown in FIGS. 7A-7D correspond to signals collected by a first, second, third and fourth silicon photomultiplier device 138 each placed at a corresponding first, second, third and fourth quadrat segment. FIG. 7E shows the sum of the respective signals shown in FIGS. 7A-7D.

In FIG. 1A the detector 124 is shown placed intermediate the pole piece 110 and the sample 106. In some embodiments, the detector 124 may be placed within the electron beam column 112, as seen in FIG. 1B. Communication with the pre-amplifier module 150 and/or the signal processing unit 152 may be via wires positioned through an aperture 156 or feed-through formed in the electron beam column 112 or any other existing aperture.

Figure 2:
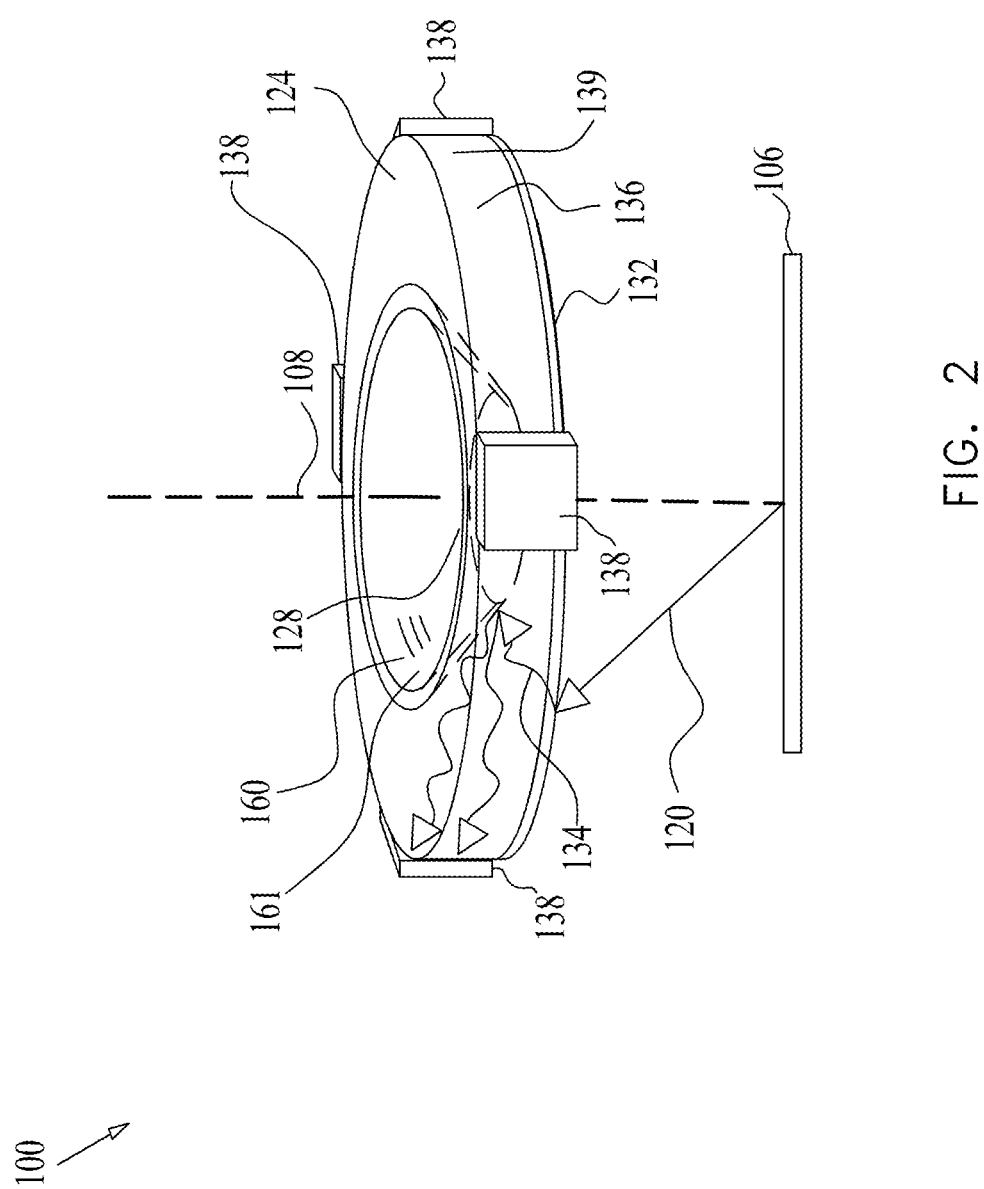
FIG. 2 is a simplified pictorial illustration of an electron detection system constructed and operative in accordance with an embodiment of the present disclosure.

Turning to FIG. 2 it is seen that the central bore 128 may be formed with an internal inclined wall 160 to further enhance the collection efficiency of the detector. In some embodiments, the inclined wall 160 may be coated by a reflective or diffusive aluminum layer 161 (or any other metallic or reflective/diffusive material), which can reflect or diffuse additional light rays (produced in the scintillator layer 132) towards the silicon photomultiplier device 138. The inclined walls 160 may reduce the instances of internal reflection in the light guide plate 136 and improve the light coupling to the silicon photomultiplier device 138, thereby increasing the light collection efficiency of the detector 124.

It is noted that the internal wall 163 of central bore 128 of FIG. 1A may be lined with a reflective or diffusive layer.

The light guide plate 136 may be formed in any suitable shape, as seen in FIGS. 3A-3E showing exemplary, non-limiting, cross sectional options of the light guide plate 136. FIG. 3A is the cross sectional illustration of the light guide plate 136 of FIG. 1. FIG. 3B is the cross-sectional illustration of the light guide plate 136 of FIG. 2. FIG. 3C is a cross sectional illustration of a light guide plate 136 formed with inclined walls 162 extending from peripheral surface 139. FIG. 3D is a cross sectional illustration of a light guide plate 136 formed with curved walls 164. FIG. 3E is a cross sectional illustration of a light guide plate 136 formed with both inclined internal walls 166 and inclined external walls 168 (also referenced as peripheral surface 139).

Figure 5:
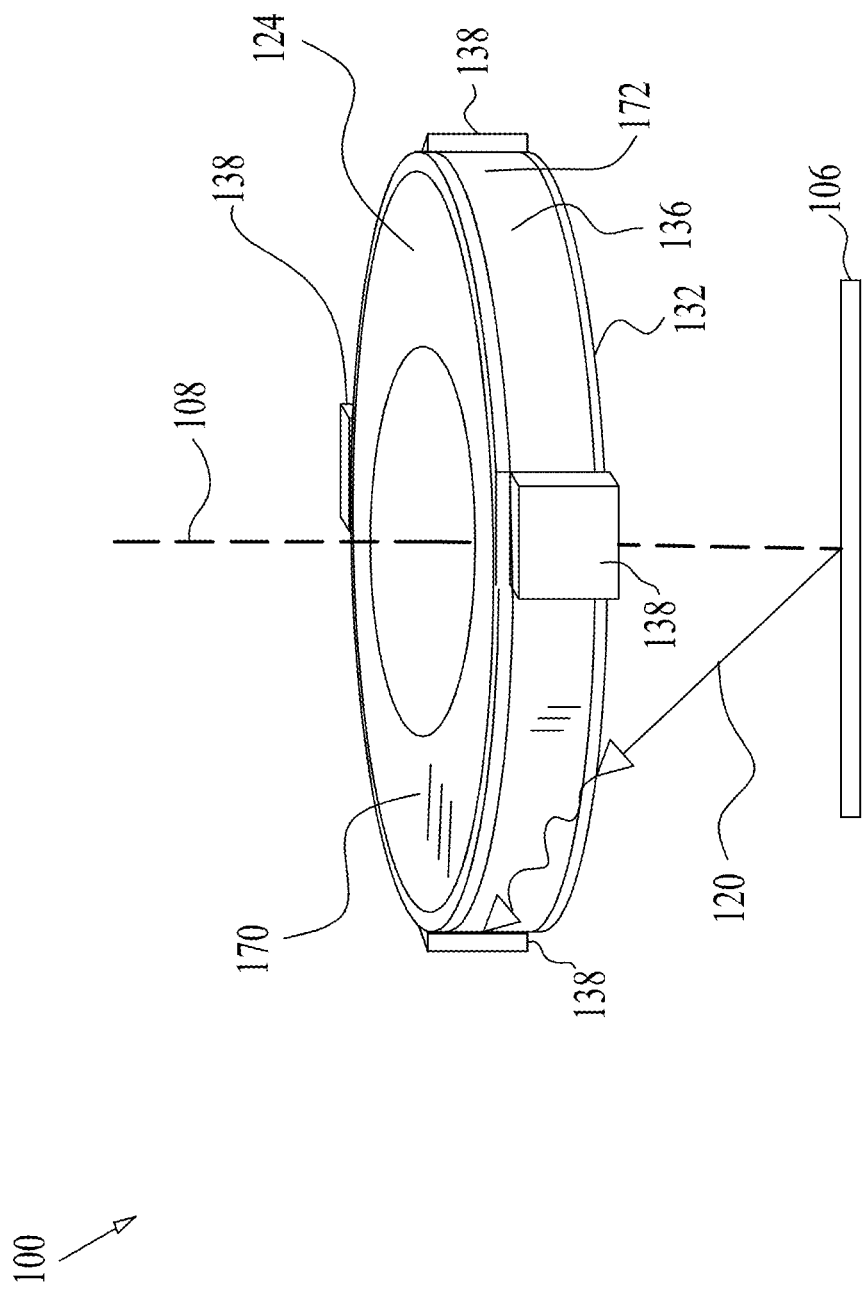
FIG. 5 is a simplified pictorial illustration of an electron detection system constructed and operative in accordance with an embodiment of the present disclosure.

As seen in FIG. 5, the detector 124 may comprise a reflective or diffusive layer formed of any suitable reflective or diffusive material, such as aluminum, for example. The reflective/diffusive layer may comprise an upper reflective/diffusive layer 170, placed partially or completely upon top surface 142 (FIG. 4), alternatively or additionally, the reflective/diffusive layer may comprise a peripheral reflective/diffusive layer 172, placed partially or completely around peripheral surface 139.

Figure 6:
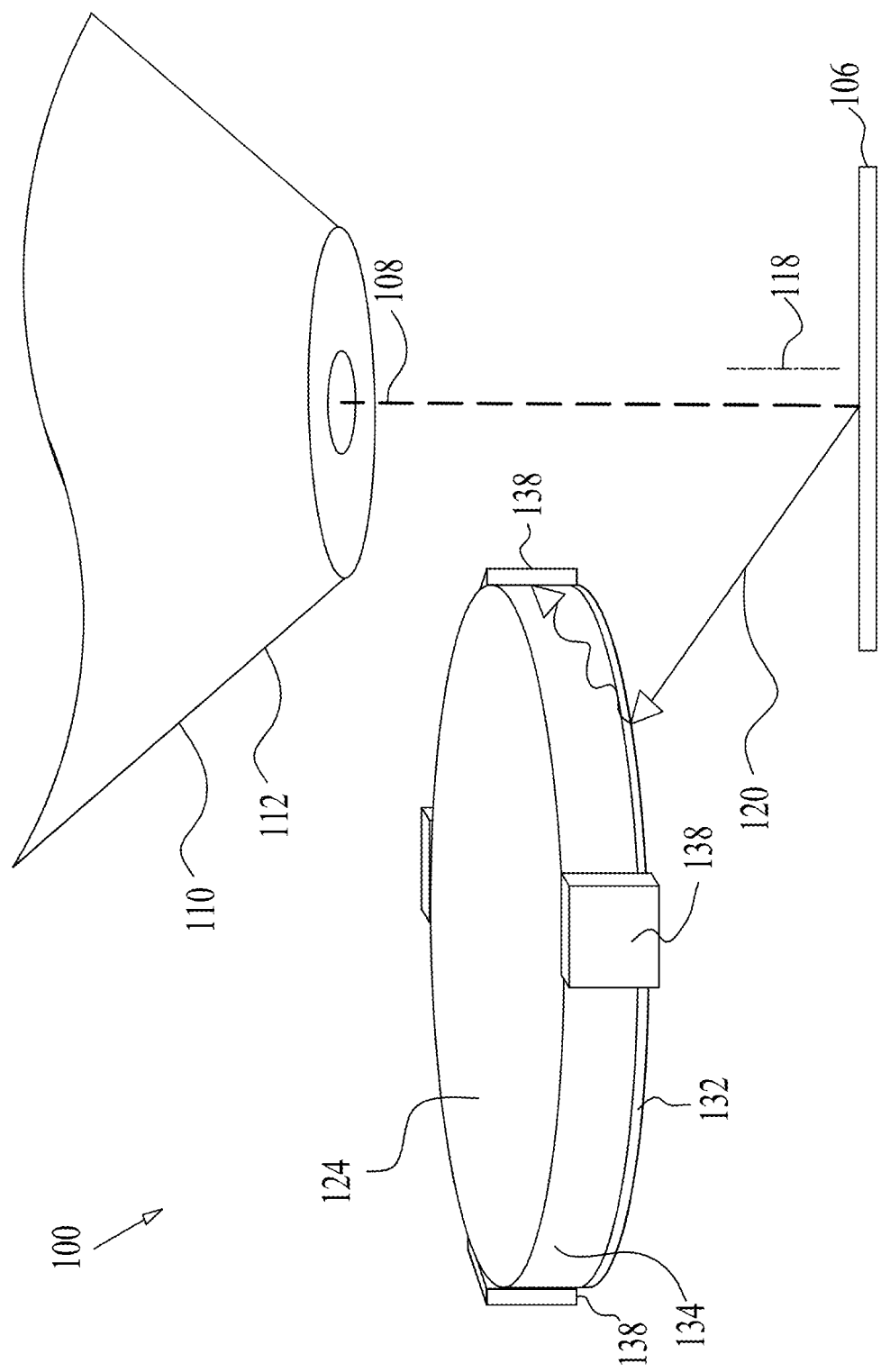
FIG. 6 is a simplified pictorial illustration of an electron detection system constructed and operative in accordance with an embodiment of the present disclosure.

The central bore 128 of the detector 124 is shown in FIGS. 1A and 1B to be aligned with the electron beam 108, which longitudinally propagates therethrough to the sample 106. Turning to FIG. 6 it is seen that in some embodiments, the detector 124 may be positioned at a lateral distance (perpendicular or oblique to axis 118) away and off-axis from electron beam column 112, thereby obviating bore 128.

In some embodiments, the detector 124 may be placed at a longitudinal distance along axis 118, as seen in FIG. 1A. Alternatively, the detector 124 may be affixed to the pole piece 110 and positioned in close proximity to an exit aperture of the column 112.

In some embodiments, the detector 124 may be configured to detect neutral, positive and/or negative ions. In such an embodiment, an ion-to electron convertor may be provided intermediate the sample 106 and the detector 124 and optionally biasing the detector 124 and/or the sample 106.

In some embodiments, the electron beam column 112 may be replaced by a Focused Ion Beam (FIB) column irradiating the sample 106 with an ion beam. The resultant SE or BSE or SE3 or ions may be detected by detector 124. In some embodiments, the resultant SE or SE3 accelerated by several kV potential may be detected by detector 124 configured to detect electrons.

In some embodiments, the photon sensor may comprise a photo-diode, an avalanche photo-diode (APD), a Geiger mode APD, a multi-pixel photon detector, a solid state photomultiplier, such a silicon photomultiplier described above and a combination thereof.

In some embodiments, the electron detection system 100 comprises one or more detectors 124. The detectors 124 may be positioned in any suitable location, such as under the pole piece 110 (FIG. 1A) within the electron beam column 112 (FIG. 1B) and/or at a lateral distance away from the electron beam path (FIG. 6) or a combination thereof.

Figure 8A:
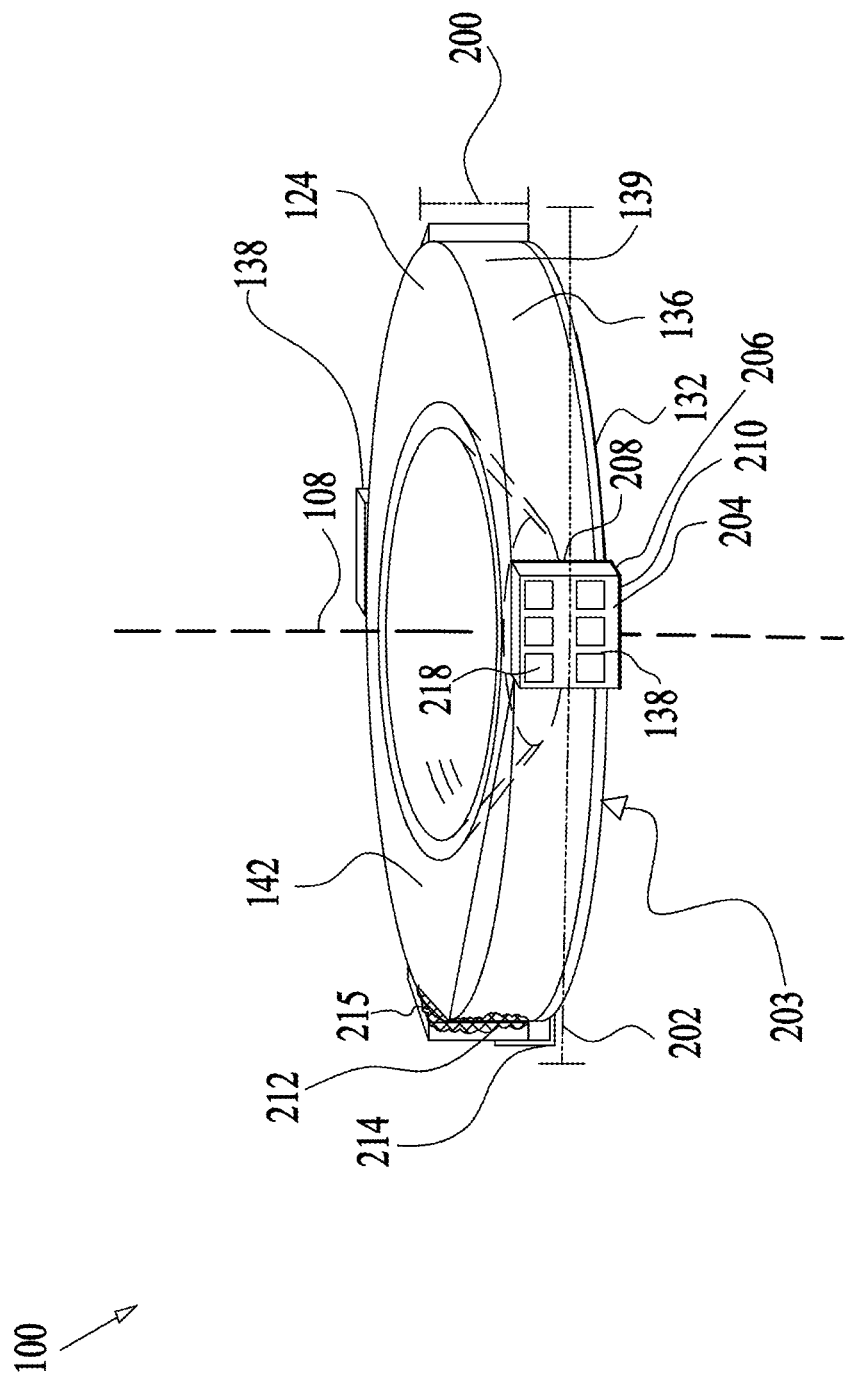
FIGS. 8A and 8B are each a simplified pictorial illustration of an electron detection system constructed and operative in accordance with an embodiment of the present disclosure.

As seen in FIG. 8A, a central longitudinal or main axis 200 of the silicon photomultiplier device 138 is arranged perpendicularly, or obliquely, namely at an angle, to a longitudinal or main axis 202 of the light guide plate 136 and the scintillator surface 203 of the scintillator layer 132. The scintillator surface 203 is parallel to top surface 142.

The silicon photomultiplier device 138 is a sensor formed as a chip with a generally flat plane surface 204 and a substantially smaller thickness (e.g. the thickness 206 is at least 40% or 20% or 10% or less or 5% or less of the height 208 or of the breadth 210 of the chip. In a non-limiting example, the height 208 or of the breadth 210 of the chip can vary from 10 microns to a few millimeters, hundreds of millimeters or thousands of millimeters, in a non-limiting example.

Figure 8B:
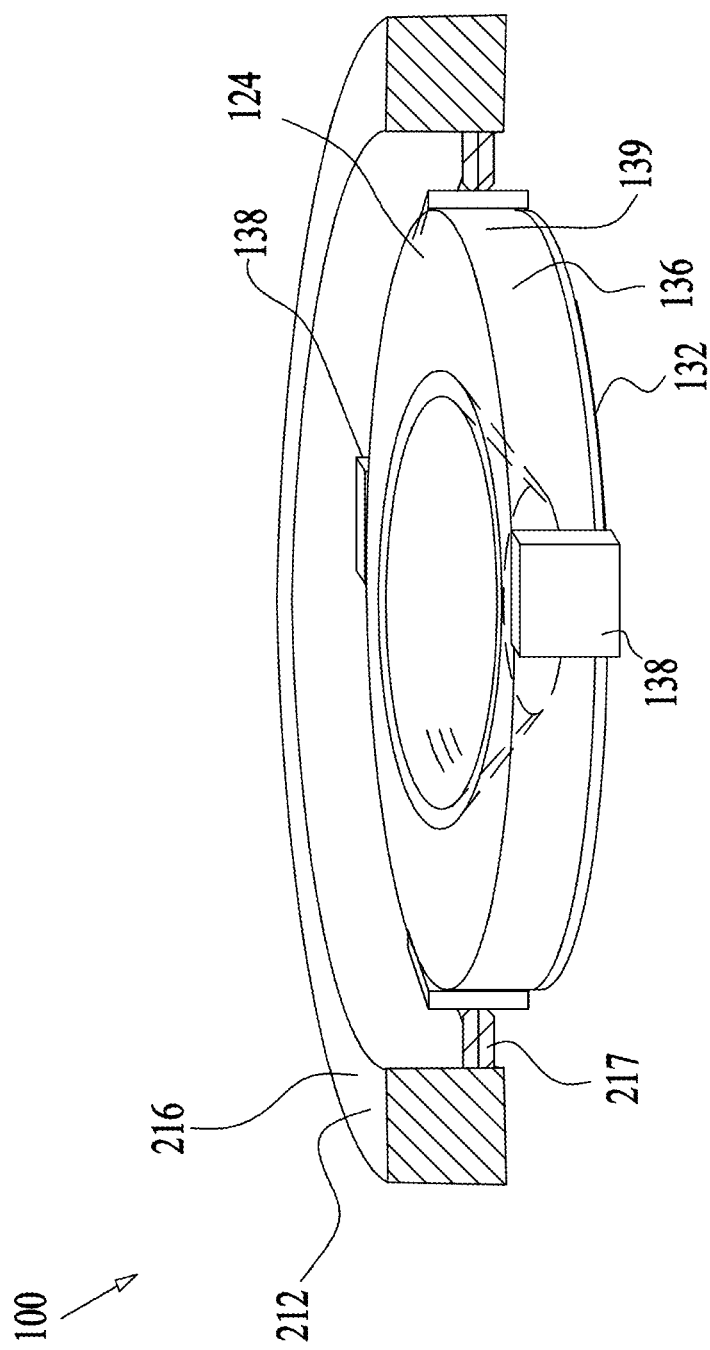

A fixing element 212 is used to adhere the flat, thin silicon photomultiplier device 138 to the curved, peripheral surface 139 of the light guide plate 136. In some embodiments, the fixing element 212 may comprise any suitable means, such as a bracket 214 for securing the silicon photomultiplier device 138 to the curved, peripheral surface 139 of the light guide plate 136. In some embodiments, the fixing element 212 may comprise an adhesive 215 for example, as shown in FIG. 8A. As seen in FIG. 8B, in some embodiments, the fixing element 212 may comprise a clamp, such as a peripheral clamp 216, here shown cut away. The peripheral clamp 216 may at least partially or fully surround the light guide plate 136 and secure the silicon photomultiplier device 138 to the peripheral surface 139 via screws 217 or any other protruding element which protrudes from the peripheral clamp 216 and contacts one or more of the silicon photomultiplier devices 138.

In some embodiments, the peripheral surface 139 may comprise flat portions 271, as shown in FIGS. 13A and 13B. The fixing element 212 may be deployed in securing the silicon photomultiplier device 138 to the peripheral surface 139 comprising the flats portions.

The plane surface 204 comprises an array of avalanche photodiodes 218 operated in Geiger mode (e.g., Single Photon Avalanche Diodes—SPADs), which can detect extremely weak light, down to the single photon. In some embodiments several hundred to thousands of SPADs are connected in parallel to form the silicon photomultiplier device 138. Each SPAD includes an integrated series resistor which quenches the avalanche and resets the diode for the next incoming photon. The silicon photomultiplier (SiPM) signal output is an electrical current proportional to the number of photons impinging the silicon photomultiplier device 138.

As seen in FIGS. 9A-10D, in some embodiments the electron detector 124 may be formed of a plurality of segments 220 engaged with the silicon photomultiplier devices 138. FIGS. 9A-9D show an exemplary electron detector 124 comprising four segments 220, where each segment 220 is coupled to a single silicon photomultiplier device 138, while FIGS. 10A-10D show an exemplary electron detector 124 comprising four segments 220, where each segment 220 is coupled to a plurality of silicon photomultiplier devices 138. The electron detector 124 may be segmented to any number of odd or even segments 220, such as two, four, five, etc.

Coupling two or more silicon photomultiplier devices 138 greatly improves the uniformity of light collection over the segment 220 and allows to maximize mean light collection efficiency by ensuring most light signals reach one of the plurality of silicon photomultiplier devices 138. Improving the mean light collection efficiency leads to considerable Signal-to-Noise Ratio (SNR) improvement per segment 220. The SNR is a feature for measuring the performance of electron detectors.

In some embodiments, the boundaries between the segments 220 are coated with a reflective coating or layer 222 or any other means or crosstalk barrier for eliminating or minimizing the transmission of light signals between the adjacent segments 220, thereby excluding crosstalk between the different segments 220. The reflective layer 222 may comprise aluminum, for example, or any other suitable reflective material, in a non-limiting example, the reflective layer 222 may comprise a thickness of a few millimeters to a few of centimeters or to tens of centimeters.

Figure 9A:
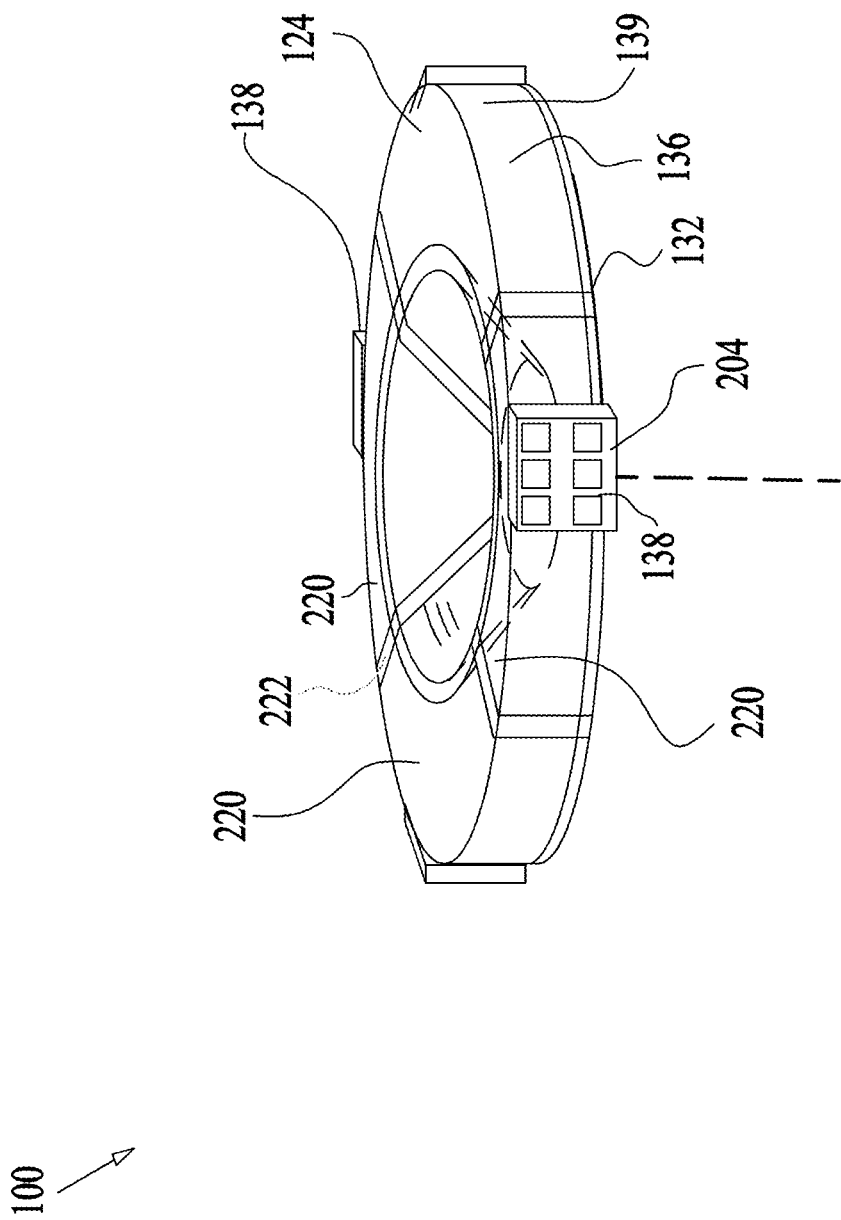
Figure 9D:
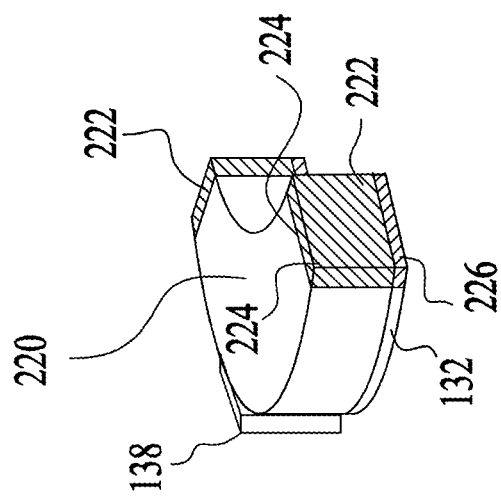
Figure 9C:
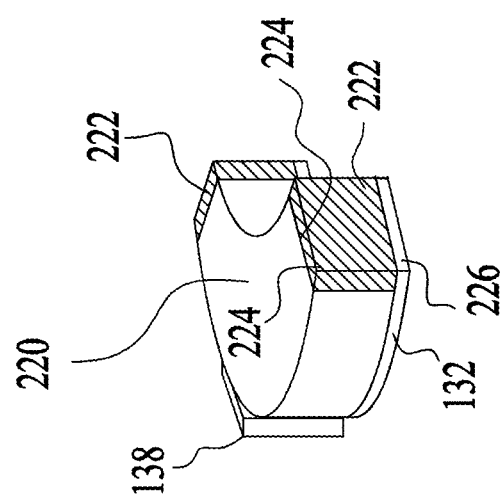
Figure 10B:
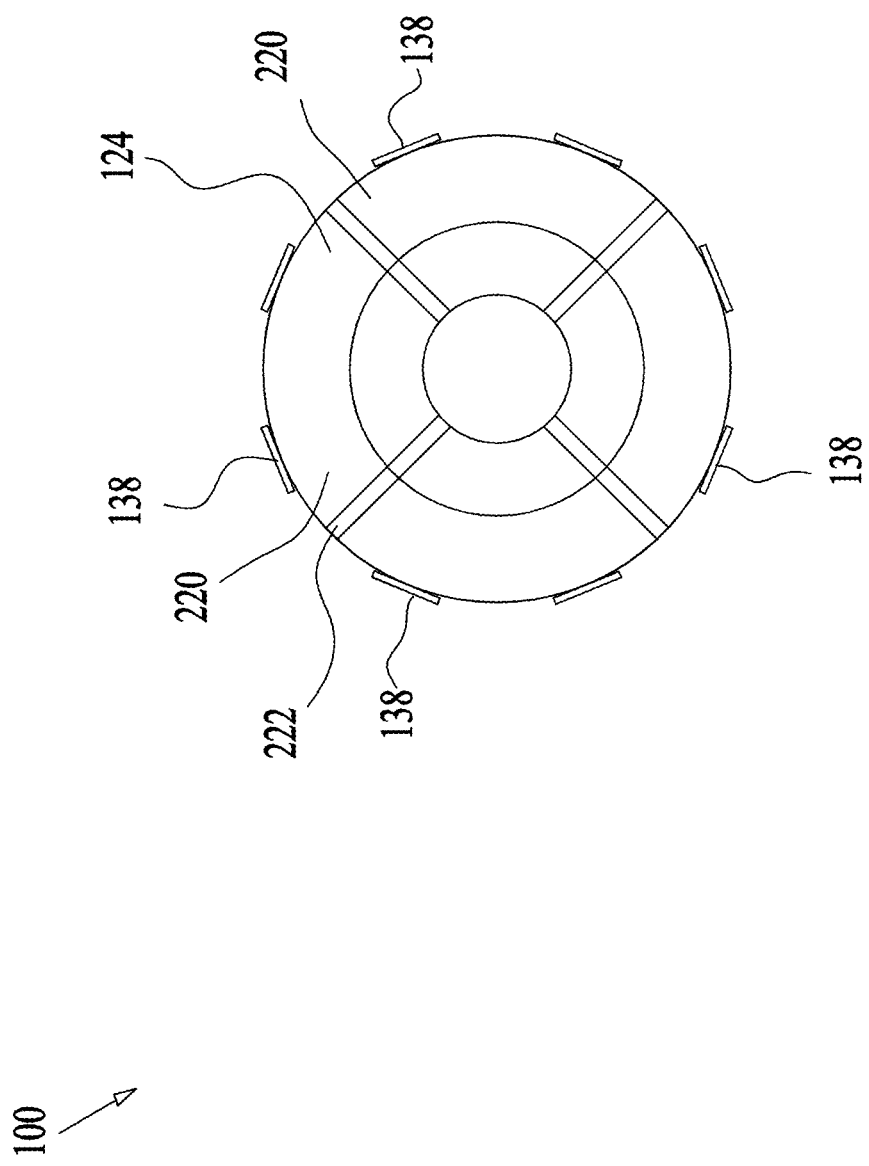
Figure 10D:
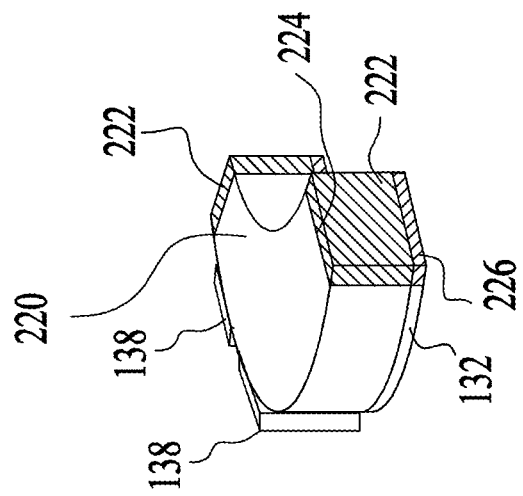
Figure 10C:
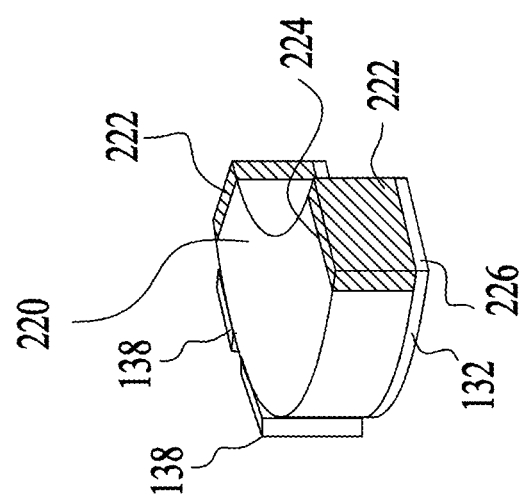

The reflective layer 222 may be formed as a layer overlaying a portion or the entire inner wall surface of a segment 220. As seen in FIGS. 9C and 10C, the reflective layer 222 covers the inner wall surface 224 of the light guide 136, while the scintillator layer 132 is unsegmented and is not covered by the reflective layer 222. As seen in FIGS. 9D and 10D, scintillator layer 132 is divided into the segments 220 and the reflective layer 222 covers the inner wall surface 224 of the light guide 136, at well as the inner wall surface 226 of the scintillator layer 132.

In some embodiments, the peripheral surface 139 and/or internal inclined wall 160 may be coated with a reflective/diffusive layer, as described hereinabove. In some embodiments, all the surfaces of the detector 124 may be coated with a reflective layer or portion. In some embodiments, the surfaces optically coupled to the silicon photomultiplier devices 138 and the scintillator layer 132 are not covered with a reflective layer.

Figure 11A:
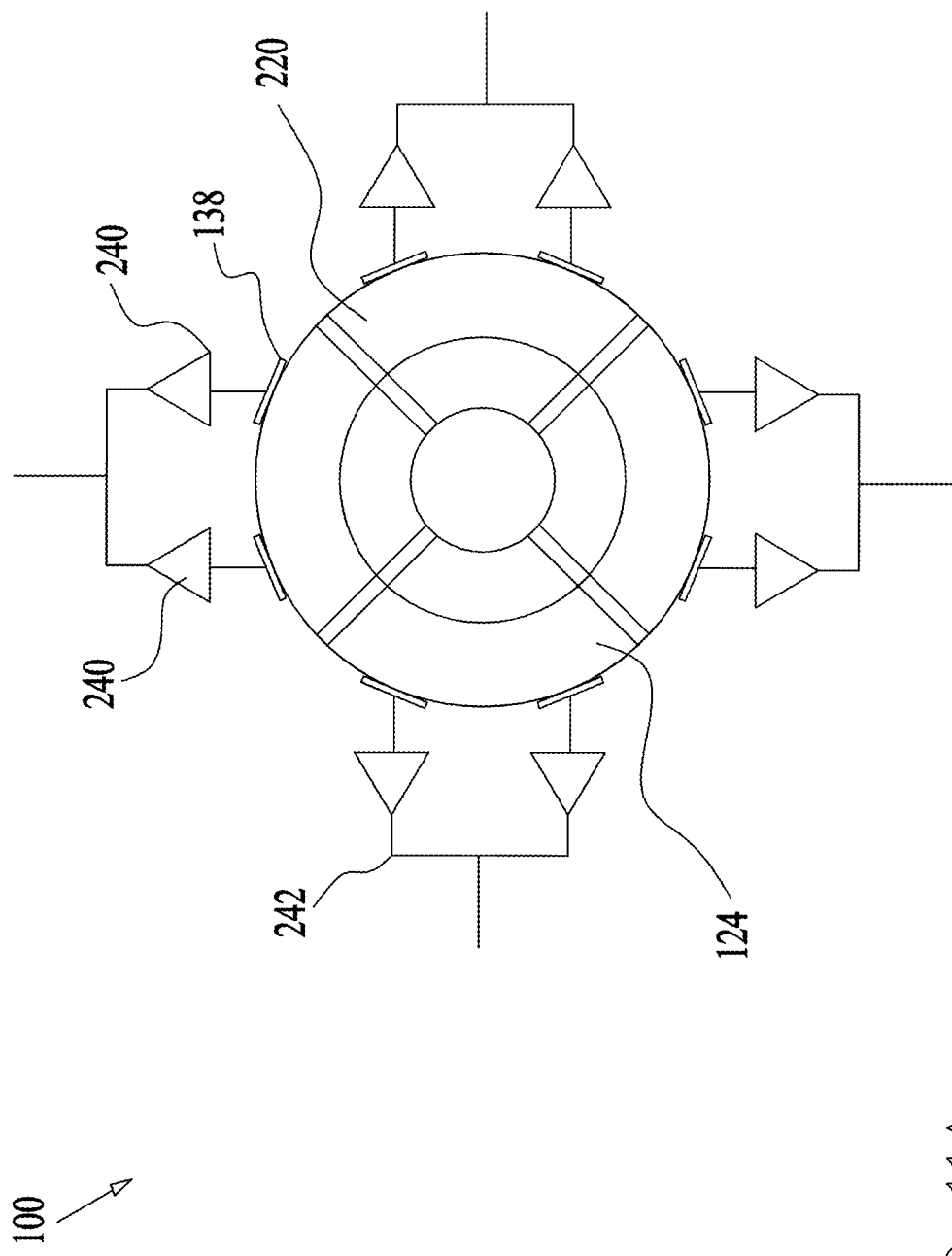
FIGS. 11A and 11B are each a top view of an electron detection system, constructed and operative in accordance with an embodiment of the present disclosure.
Figure 11B:
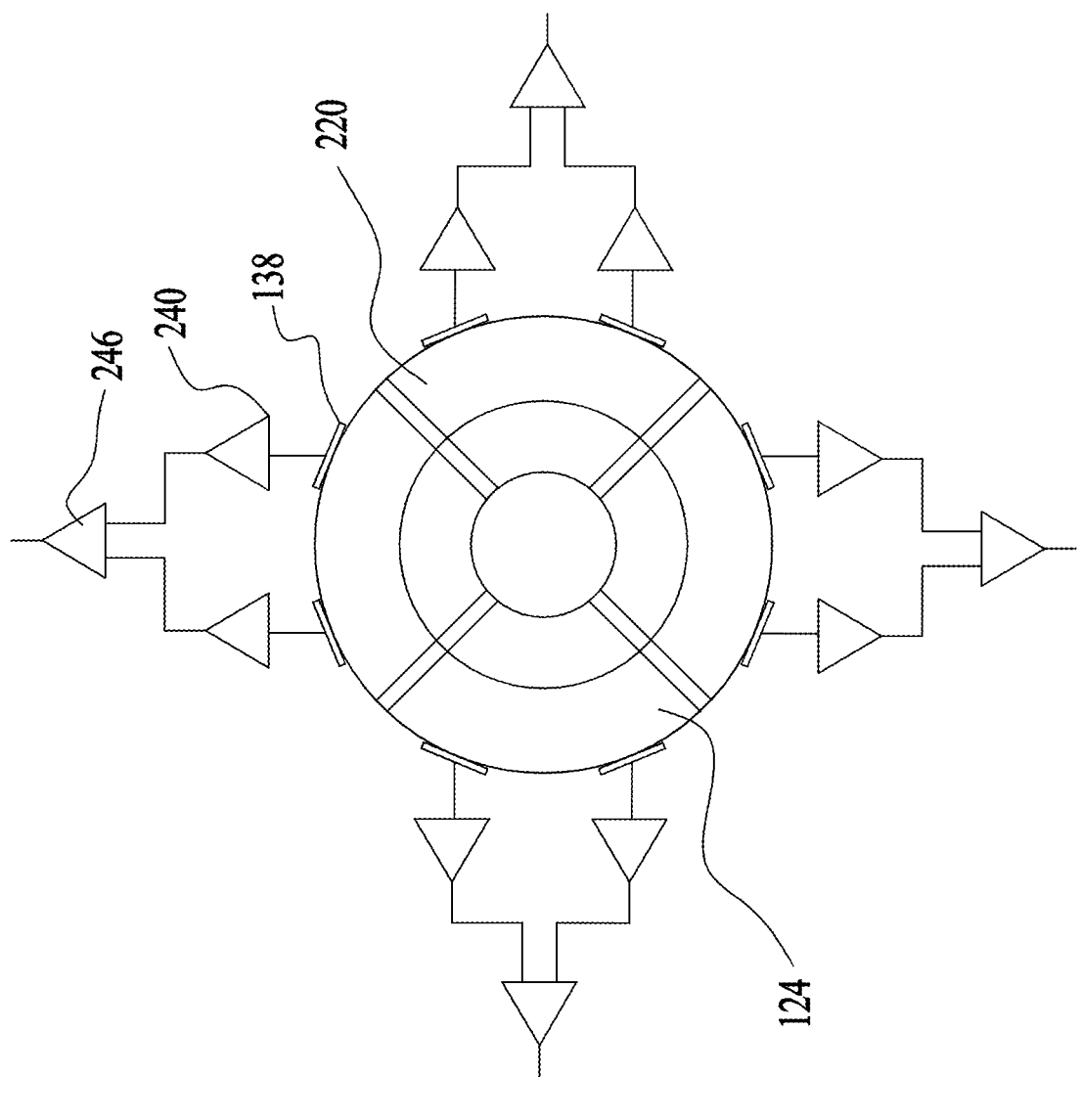

At times, connecting signals from different silicon photomultiplier devices 138 to an input of the same pre-amplifier may lead to a proportional increase of the pre-amplifier dark noise due to the increased input capacitance. To avoid this dark (electronic) noise boost effect and keep the electron detector's shot noise limited, each (or at least a few) of the plurality of the silicon photomultiplier devices 138 may be connected to its separate, individual pre-amplifier 240, as shown in FIGS. 11A and 11B. The output of the plurality of pre-amplifiers 240 of a common segment 220 may be connected directly to each other via appropriate wiring 242, as shown in FIG. 11. In FIG. 11A, wherein an output of a first individual pre-amplifier 240 is connected directly to an output of a second individual pre-amplifier 240. As seen in FIG. 11B, the output of the plurality of common pre-amplifiers 240 may be connected thereto via an additional summing amplifier 246 or any other suitable device. The additional summing amplifier 246 with its unity gain serves also as a buffer.

Connecting the silicon photomultiplier device 138 to its separate, individual pre-amplifier 240, as shown in FIGS. 11A and 11B, may be performed for any of the silicon photomultiplier devices 138 described in reference to FIGS. 1-10D.

Figure 12:
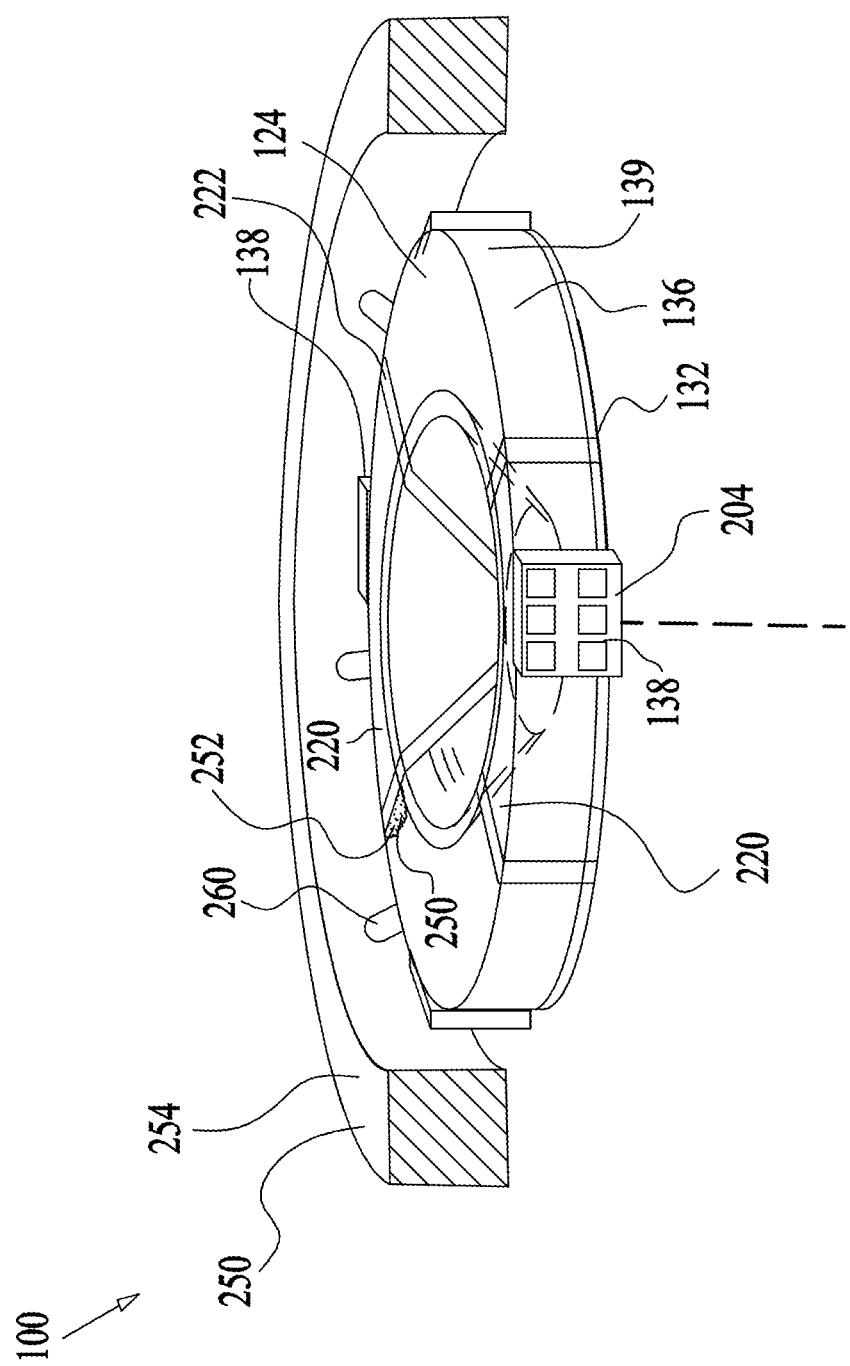
FIG. 12 is a simplified pictorial illustration of an electron detection system, constructed and operative in accordance with an embodiment of the present disclosure.

As seen in FIG. 12, the segments 220 and/or the reflective layers 222 may be secured to each other in any suitable manner via a securing element 250. In some embodiments, the securing element 250 may comprise an adhesive 252 for adhering the segments 220 to the reflective layers 222 and/or the segments 220 to each other. In some embodiments, the securing element 250 may comprise a securing clamp 254, here shown cut away. The securing clamp 254 may be configured to at least partially peripherally surround the light guide plate 136 and press upon the segments 220 and/or the reflective layers 222 via bolts 260 or any other protruding element which protrudes from the securing clamp 254.

According to some embodiments, the light guide plate 136 may be configured in any suitable shape. The light guide plate 136 may be configured with the peripheral surface 139 shaped as an annular disk. The annular disk may comprise a curved, smooth peripheral surface 139, as shown in FIG. 1A. In some embodiments, the annular disk may be shaped in an annular-like shape, such that the peripheral surface 139 may be configured with flat portions, such as a polygon surface. In some embodiments, the polygon surface may comprise a convex polygon surface 270, such as shown in FIGS. 13A and 13B. A convex polygon is a simple polygon (not self-intersecting) in which no line segment between two points on the boundary extends outside the polygon. In some embodiments, the polygon surface may comprise a concave polygon surface or any other shape formed with flat surfaces 271. The polygon surface may be formed with straight/flat surfaced edges 272. In some embodiments, the edges 272 may be generally flat and the peripheral surface 139 may be coupled to at least one or more edges 272. The scintillator layer 132 may also be configured as a polygon surface which may comprise a convex polygon surface or the scintillator layer 132 may be shaped in any suitable shape, the same or different than the light guide plate 136 configuration. In some embodiments, the peripheral surface 139 may comprise flat surfaces as well as curved surfaces. FIG. 13A illustrates an unsegmented detector 124 and FIG. 13B illustrates a segmented detector 124.

While various inventive embodiments have been described and illustrated herein, those of ordinary skill in the art will readily envision a variety of other means, materials, or structure for performing the function, obtaining the results, or one or more of the advantages described herein, and each of such variations or modifications is deemed to be within the scope of the inventive embodiments described herein. More generally, those skilled in the art will readily appreciate that all parameters, dimensions, materials, and configurations described herein are meant to be for example only and that the actual parameters, dimensions, materials, and configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims, equivalents thereto, and any claims supported by the present disclosure, inventive embodiments may be practiced otherwise than as specifically described and claimed. Inventive embodiments of the present disclosure are directed to each individual feature, system, article, material, composition, kit, method, and step, described herein. In addition, any combination of two or more such features, systems, articles, materials, compositions, kits, methods, and steps, if such features, systems, articles, materials, compositions, kits, methods, and steps, are not mutually inconsistent, is included within the inventive scope of the present disclosure. Embodiments disclosed herein may also be combined with one or more features, functionality, or materials, as well as complete systems, devices or methods, to yield yet other embodiments and inventions. Moreover, some embodiments, may be distinguishable from the prior art by specifically lacking one and/or another feature disclosed in the particular prior art reference(s); i.e., claims to some embodiments may be distinguishable from the prior art by including one or more negative limitations.

Also, as noted, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Any and all references to publications or other documents, including but not limited to, patents, patent applications, articles, webpages, books, etc., presented anywhere in the present application, are herein incorporated by reference in their entirety. Moreover, all definitions, as defined and used herein, should be understood to control over dictionary definitions, definitions in documents incorporated by reference, and ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An electron detector assembly configured for detecting electrons emitted from a sample irradiated by an electron beam, comprising:
    a scintillator comprising a scintillator layer including a scintillating surface, the scintillator layer emitting light signals corresponding to impingement of electrons upon the scintillating surface;
    a light guide plate coupled to the scintillator layer and comprising a peripheral surface, the light guide plate being segmented into two or more segments; and
    two or more silicon photomultiplier devices positioned upon the peripheral surface of a least one of the segments, wherein the two or more silicon photomultiplier devices are arranged perpendicularly or obliquely relative to the scintillating surface, the silicon photomultiplier device being configured to yield an electrical signal from an electron impinging upon the scintillator surface,
    wherein the light guide comprises the shape of at least one or more of,
        a convex polygon, and
        an annular disk.

2. An electron detector assembly according to claim 1, wherein at least one or more of the two or more silicon photomultiplier devices is connected to its individual pre-amplifier.

3. An electron detector assembly according to claim 2, wherein, in a common segment, an output of a first individual pre-amplifier is connected directly to an output of a second individual pre-amplifier.

4. An electron detector assembly according to claim 2, wherein, at least two individual pre-amplifier outputs are connected to an additional amplifier, which provides a summing and buffering function for, at least, two signals from corresponding silicon photomultiplier devices attached to the common segment.

5. An electron detector assembly according to claim 1, wherein the light guide plate is formed with a central bore to allow the electron beam to propagate therethrough.

6. An electron detector assembly according to claim 5, wherein the central bore is formed with an internal inclined wall in respect to the scintillator surface.

7. An electron detector assembly according to claim 5, wherein the central bore is formed with an internal wall coated with a partial or complete reflective/diffusive layer.

8. An electron detector assembly according to claim 1, wherein the assembly is positioned within an electron beam column.

9. An electron detector assembly according to claim 1, wherein at least a portion of a wall surface of a segment is covered with a reflective layer, the wall surface is substantially perpendicular to the scintillator surface.

10. An electron detector assembly according to claim 9, wherein the scintillator layer is segmented into the two or more segments and is covered with the reflective layer at its wall surface.

11. An electron detector assembly according to claim 9, wherein at least one of the segments is coupled to two or more silicon photomultiplier devices positioned on the peripheral surface.

12. An electron detector assembly configured for detecting electrons emitted from a sample irradiated by an electron beam, comprising:
    a scintillator comprising a scintillator layer including a scintillating surface, the scintillator layer emitting light signals corresponding to impingement of electrons upon the scintillating surface;
    a light guide plate coupled to the scintillator layer and comprising a peripheral surface;
    a single or plurality of silicon photomultiplier devices positioned upon the peripheral surface, wherein the silicon photomultiplier devices are arranged perpendicularly or obliquely relative to the scintillating surface, the silicon photomultiplier device being configured to yield an electrical signal from an electron impinging upon the scintillator surface,
    wherein the silicon photomultiplier device is formed as a chip with a generally flat plane surface, and
    wherein the light guide comprises the shape of at least one or more of
        a convex polygon, and
        an annular disk; and
    a fixing element for securing the flat plane surface of the chip to the peripheral surface of the light guide plate.

13. An electron detector assembly according to claim 12 wherein the peripheral surface is configured as a curved surface.

14. An electron detector assembly according to claim 12 wherein the peripheral surface is configured with at least some flat portions or flat edges.

15. An electron detector assembly according to claim 14 wherein at least one of the silicon photomultiplier devices is attached to a flat edge.

16. An electron detector assembly according to claim 12 wherein the fixing element comprises a clamp configured to at least partially surround the light guide plate.

17. An electron detector assembly according to claim 16 wherein the clamp comprises a protruding element for pressing upon the silicon photomultiplier device.

18. An electron detector assembly configured for detecting electrons emitted from a sample irradiated by an electron beam, comprising:
- a scintillator comprising a scintillator layer including a scintillating surface, the scintillator layer emitting light signals corresponding to impingement of electrons upon the scintillating surface;
- a light guide plate coupled to the scintillator layer and comprising a peripheral surface, and
- one or more silicon photomultiplier devices positioned upon the peripheral surface, wherein the one or more silicon photomultiplier devices are arranged perpendicularly or obliquely relative to the scintillating surface, the silicon photomultiplier device being configured to yield an electrical signal from an electron impinging upon the scintillator surface,
- wherein the light guide comprises the shape of at least one or more of
  - a convex polygon, and
  - an annular disk.

* * * * *